United States Patent [19]

Lippey

[11] Patent Number: 4,863,090
[45] Date of Patent: Sep. 5, 1989

[54] ROOM TEMPERATURE ATTACHMENT METHOD EMPLOYING A MERCURY-GOLD AMALGAM

[75] Inventor: Barret Lippey, Los Angeles, Calif.
[73] Assignee: Hughes Aircraft Company, Los Angeles, Calif.
[21] Appl. No.: 258,752
[22] Filed: Oct. 17, 1988
[51] Int. Cl.⁴ .............................................. B23K 20/16
[52] U.S. Cl. ................................... 228/116; 228/121; 228/124
[58] Field of Search ................ 228/116, 121, 124, 122
[56] References Cited

U.S. PATENT DOCUMENTS 2,094,483  9/1937  Weder .
2,232,176  2/1941  Guthrie .
2,737,711  3/1956  Smith .
3,110,089  11/1963 Hill .
3,141,238  7/1964  Harman, Jr. .
3,372,476  3/1968  Peiffer et al. .
3,448,503  6/1969  Trott et al. ..................... 228/263.12
3,590,467  7/1971  Chase et al. .
3,798,746  3/1974  Alphonse et al. .................. 228/116
3,839,780  10/1974 Freedman et al. .
4,247,034  1/1981  Burkart et al. ..................... 228/116

Primary Examiner—Kenneth J. Ramsey
Attorney, Agent, or Firm—William J. Streeter; Mark J. Meltzer

[57] ABSTRACT

A method of bonding molybdenum and zinc sulfide devices (10, 12) together comprising the steps of lapping the surface of the nickel layers to about a 20,000 Angstrom smoothness, placing nickel layers (16, 16') of about 700 Angstroms respectively on the devices, plating layers of gold (18, 18') of about 4 microns thickness respectively on the nickel layers, respectively immersing the gold-plated layers in a bath (20) of mercury, inverting one (10) of the devices above the other (12), bringing the devices together to effect contact between the mercury films (22, 22'), pressing the devices together within a pressure range of 2 kilograms per square inch to 20 kilograms per square inch for a minimum of 16 hours at room temperature, and sealing the periphery of the gold-mercury seal contact with a nickel seal (26).

17 Claims, 1 Drawing Sheet

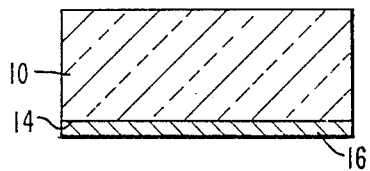
Fig. 1.
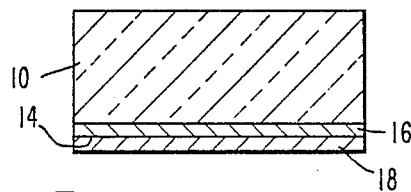
Fig. 2.
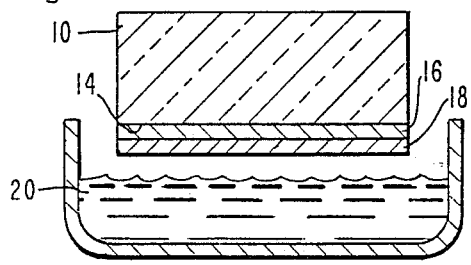
Fig. 3.
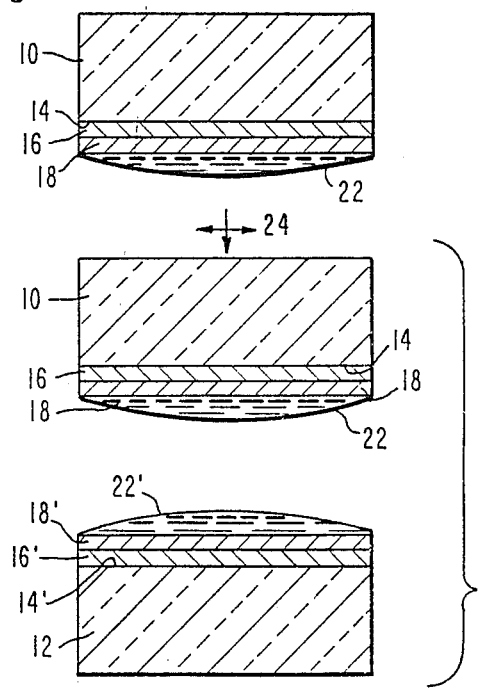
Fig. 4.
Fig. 5.
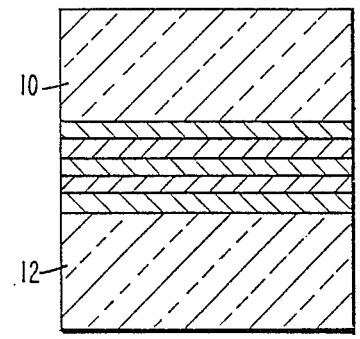
Fig. 6.
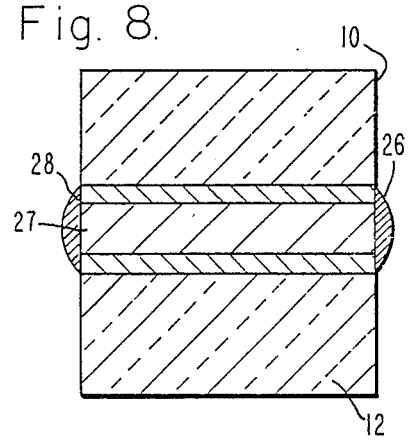
Fig. 8.
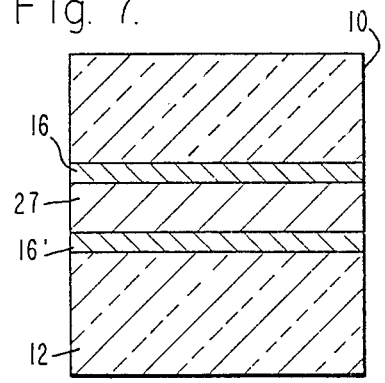
Fig. 7.

ROOM TEMPERATURE ATTACHMENT METHOD EMPLOYING A MERCURY-GOLD AMALGAM

BACKGROUND OF THE INVENTION

This invention was made with Government support under a contract awarded by a Department of the United States Government. The Government has certain rights in this invention.

The present invention relates to a method of joining surfaces together at room temperature, in particular by a mercury gold amalgam.

Electrical and optical devices have been joined together by such bonding agents as solder, braze materials and cements comprising organic materials, such as epoxy resins. Where heating is not a problem, soldering and brazing work well. Where outgassing is not a problem, epoxy resins are used. In many cases, however, such bonding techniques are not usable, for example, where the two devices to be joined together have different coefficients of thermal expansion, where heating may create undesired stresses in the bonded-together devices, and where outgassing from organic bonding materials creates problems in maintaining the components clean. The performance of optical components is particularly sensitive to their degree of cleanliness.

Many of the above problems have been overcome by use of the intermetallic bonding techniques suggested in U.S. Pat. No. 3,839,780 in which an amalgam or intermetallic compound is used to bond together two metal surfaces to provide a thermally and electrically conductive bond. The amalgams suggested there include a metal such as mercury, gallium or indium and one of the noble metals such as copper, gold, nickel, silver and palladium. Three methods are described. One utilizes a frozen mixture or "solid mush" which, by allowing it to warm up to room or a higher temperature, the metals to be joined are wetted, after which the bond results. In the second method, small particles of one of the components of the intermetallic amalgam are coated on their exterior in order to prevent interaction. When the coatings are fractured as by abrading or cracking, the constituents can then unite to produce an amalgam for the bonding. The third described method applies the constituents by simultaneously electro-plating or otherwise coating the surfaces to be joined together. For this third method, a solid mush of a frozen amalgam is melted and spread along the surfaces of the members to be joined or electro-plated at a temperature below the melting point of the constituent amalgam parts. By storing the parts to be bonded at a reduced temperature, bonding and formation of the amalgam is prevented. When bonding is desired, the devices to be bonded are properly assembled and the temperature is raised to melt the amalgam.

SUMMARY OF THE INVENTION

The present invention provides further methods of utilizing a preferred combination of gold and mercury as the amalgam and of applying the amalgam.

Briefly, a gold layer is placed on surfaces of devices to be bonded together, the gold layers on each device are wetted with mercury for providing a mercury film including a mercury gold amalgam, and the two devices are mated and joined together by establishing a contact between the mercury films on the respective devices. After excess mercury is removed, the periphery of the mating contact between the two devices is sealed to prevent loss of mercury and, therefore, the bond between the two devices.

Several advantages are derived from this arrangement. The bonding can be performed at room temperature without the need of flux or a low oxygen atmosphere because neither gold nor mercury oxidize at room temperature in air. Because of the very high surface tension of mercury and the high wettability of gold with mercury, the inventive bonding method produces a completely void-free bond even when the bonding extends over a large area. The result is a thin, rigid and thermally conductive bondline which is well adapted for high reliability optics, without the problems, for example, of the organic, moisture and oxygen outgassing of organic adhesives. It thereby avoids the requirement of prior attachment techniques which requires vacuum and/or high clamping pressures or temperatures. Any outgassing of mercury is reduced and substantially eliminated by sealing the periphery about the bondline.

Other aims and advantages, as well as a more complete understanding of the present invention, will appear from the following explanation of an exemplary embodiment and the accompanying drawings thereof.

DESCRIPTION OF THE DRAWINGS

FIG. 1 is a side view of one device to be processed for attachment to another device which, for illustrative purposes are similarly configured, and on which a nickel surface is placed;

FIG. 2 shows the addition of a gold surface placed on the nickel surface of FIG. 1;

FIG. 3 illustrates the dipping process for placing a mercury film over the gold surface of the device of FIG. 2;

FIG. 4 depicts the device with the mercury film wetting the gold surface after the dipping step shown in FIG. 3;

FIG. 5 illustrates the two devices, each having nickel, gold and mercury deposits thereon, in readiness for attachment together;

FIG. 6 depicts the two devices immediately after having been attached and at the commencement of amalgamation; and FIG. 7 is a view of the attached devices similar to that depicted in FIG. 6, but illustrating the attachment at the completion of amalgamation;

FIG. 8 shows the finished part with a nickel seal placed about the periphery of the bonded joint, to prevent escape of the mercury through evaporation from the joint.

DETAILED DESCRIPTION OF THE PREFERRED EMBODIMENT

A pair of devices 10 and 12 to be bonded together, see also FIG. 5, may comprise any electronic or electrical device. Examples include optical mirrors, or other high reliability optical elements, and electronic elements, such as package-ring frames, lids, semiconductor chips or heat sensitive devices such as cryogenic detectors or materials whose coefficients of thermal expansion may be mismatched, such as of molybdenum and zinc sulfide.

Because the processing of one device is the same as the other prior to their attachment as described and shown in FIGS. 5-8, the processing of one device 10 as shown in FIGS. 1-4 is the same as that for other device 12.

Accordingly, as illustrated in FIG. 1, device 10 has a surface 14 which is to be prepared for bonding to a similar surface on device 12. Since the surfaces and the processing thereof of devices 10 and 12 are the same, similar numerals will be used for both, the only distinction being that the corresponding parts for device 12 will be indicated by a "prime" superscript, e.g., the surface on device 12 which corresponds to surface 14 of device 10 is identified by indicium 14'.

Surfaces 14 and 14' are lapped or otherwise prepared so that each will have a sufficient flatness to ensure a uniform composition of the gold mercury amalgam to be applied thereto. It has been found that a lapping to within 20,000 Angstroms per inch flatness would ensure such uniformity. It has also been found that, if the lapping were less than a 20,000 Angstrom per inch flatness, the composition tended to be sufficiently nonuniform to result in a weak bond. The cause of the weak bond appeared to be too little of one or the other of the gold-mercury amalgam components. In general, the flatter that the surface is, the better is the bond.

Thereafter, layers of nickel 16 and 16' were placed on respective surfaces 14 and 14'. A deposit of 700 Angstroms of nickel was found to be sufficient to act as a barrier layer between the gold to be deposited on the nickel and the material of device 10 or 12. Nickel is preferred because it is insoluble with gold and mercury; however, any other material, such as chromium or chromium nickel, which would act as a barrier layer, would also be suitable.

Layers 18 and 18' of gold were then deposited respectively on nickel layers 14 and 14' to a depth of 4 microns, with a surface average peak to peak roughness of between 100 and 700 Angstroms. While silver, copper and other metals could be used in place of gold, it is believed that their performance is inferior to that of gold. Any conventional process or deposition was found suitable, the usual procedures being vacuum deposition and electroplating. A thickness of 4 microns of gold appeared to provide an optimum result. If there were too little gold, too great a percentage of the gold would be combined with the mercury to prevent bonding. If too much gold were applied, then after devices 10 and 12 were placed together in contact, the mercury would later be absorbed into the gold, also resulting in a weaker bond. Further, if the gold surface were too smooth, not enough mercury would wet the gold surface to provide the amalgam, and the devices would fall apart. If the gold surface were not sufficiently smooth, too much mercury would combine with the gold, resulting in poor adhesion properties. Therefore, it was found that an average peak to peak roughness of between 100 and 700 Angstroms provided the best results.

The as-processed substrates or devices were then positioned so that the nickel and gold layers could be inserted into a mercury bath 20 until they were completely wetted. Devices 10 and 12 were thus provided with mercury layers 22 and 22' completely covering gold layers 18 and 18'.

The two devices were then placed in preparation for bonding together as shown in FIG. 5, with device 12 being placed face up and device 10 being placed face down. To ensure that sufficient mercury was on device 12, additional mercury was added to that already on device 12. Device 10 was then moved with respect to device 12 to align the two devices and then lowered into contact so that its mercury surface 22 came into contact with mercury layer 22' of device 12. The positioning of the two devices as shown and described enabled a preferred bonding.

Specifically, because device 10 was positioned face down so that mercury layer 22 hung gravitationally downward, it formed a shape as shown in FIG. 5 with greater mercury in the center and lesser at the sides so that, when the two devices were brought together, there would be contact between the respective mercury layers at their centers and the contact would then progress from the centers to the edges. This progressive contact ensured that voids would be eliminated and that any air would be pushed outward toward the edges.

Positioning of device 10 with respect to device 12 was by an x—y—z positioner 24 of conventional construction. A joining pressure of approximately 2-20 kilograms per square inch provided sufficient bonding. This pressure drove out the majority of the mercury, and left a thin film of mercury at which time the bonding occurred. Pressures outside of these suggested limits appeared to provide too much or too little mercury film respectively between the two devices.

The resulting construction, shown in FIGS. 6 and 7, illustrate the stages of amalgamation respectively from separate mercury and gold layers, to a uniform amalgamated layer 27. The construction shown in FIG. 7 was further processed to remove any excess mercury, such as by being wiped or blown away with a jet of air. While remaining under the pressure, the greatest bond strength resulted in approximately 16 hours without baking. Complete amalgamation occurred at about 200 hours. While baking was not necessary, baking could be used to accelerate complete amalgamation if the parts were amenable thereto and would not be harmed by the applied heat. Finally, as shown in FIG. 8, a seal 26, for example of nickel, was placed about the periphery 28 of the contacting devices. This seal is used to hermetically seal the bondline and to prevent the mercury from evaporating or outgassing and, thus, to prevent weakening of the bond. Nickel seal 26 was placed by any adequate sealing process, such as by brush plating.

Although the invention has been described with respect to a particular embodiment thereof, it should be realized that various changes and modifications may be made therein without departing from the spirit and scope of the invention.

What is claimed is:

1. A method of bonding devices together comprising the steps of:
    placing gold respectively on both devices wetting the gold layers with mercury for providing a mercury film thereover including a mercury-gold amalgam;
    mating the two devices together by establishing a contact between the mercury films of the respective devices; and
    placing a seal about the periphery of the contact between the devices.

2. A method according to claim 1 in which the seal comprises nickel.

3. A method of bonding devices together comprising the steps of:
    providing barrier layers respectively on the devices having a thickness sufficient for acting as a barrier between gold to be layered on the barrier layers and the underlying devices;
    placing gold layers respectively on both barrier layers;

wetting the gold layers with mercury for providing a mercury film thereover including a mercury-gold amalgam; and mating the two devices together by establishing a contact between the mercury films of the respective devices.

4. A method according to claim 3 in which said wetting step comprises the step of immersing the gold layers into a mercury bath for providing the mercury film over the entire gold layers including the gold-mercury amalgam.

5. A method according to claim 3 in which said gold layer placing step comprises the step of plating both devices with gold.

6. A method according to claim 5 in which said wetting step comprises the step of immersing the gold-plated portions of the devices into a mercury bath for providing the mercury film over the entire gold plates including the gold-mercury amalgam.

7. A method according to claim 3, further comprising the steps of:

placing one device above the other for causing the mercury film on one of the devices to be gravitationally downwardly suspended, thus permitting the mercury film to bulge at its center towards the other of the devices and the mercury thereon, and moving the devices together for enabling initial contact between the centers of the respective mercury films and thence for extending the contact from the centers to the exteriors of the devices, thereby to exclude voids between the contacting mercury films.

8. A method according to claim 3 in which said barrier layer providing step comprises the step of providing a surface on each of said barrier layers, which surfaces are sufficiently flat for ensuring a uniform composition of the gold-mercury amalgam.

9. A method of bonding devices of nickel material together comprising the steps of:

providing a thickness of the nickel material sufficient for acting as a barrier between gold to be provided on the devices and the underlying respective devices;

providing a surface on each device which is sufficiently flat for ensuring a uniform composition of a gold-mercury amalgam, which is to be provided on the devices, placing a gold layer on both devices;

wetting the gold layers with mercury for providing a mercury film thereover including a mercury-gold amalgam; and mating the tow devices together by establishing a contact between the mercury films of the respective devices.

10. A method according to claim 8 in which the device material comprises nickel having a minimum thickness of 700 Angstroms.

11. A method according to claim 8 in which said layer step comprises the step of lapping the material to at least 20,000 Angstroms flatness.

12. A method according to claim 8 in which the device material comprises one of nickel, chromium and chromium-nickel alloy.

13. A method according to claim 11 in which said gold layer placing step comprises the step of plating both devices with gold.

14. A method according to claim 8 in which the barrier layer comprises one of nickel, chromium and a combination thereof.

15. A method according to claim 3 further comprising the step of:

lapping the barrier layers to a surface quality which is sufficiently flat for ensuring a uniform composition of the gold-mercury amalgam.

16. A method of bonding molybdenum and zinc sulfide devices together comprising the steps of:

placing nickel layers of about 700 Angstroms respectively of the devices;

lapping the surface of the nickel layers to about a 20,000 Angstrom smoothness;

plating layers of gold of about 4 microns thickness respectively on the nickel layers;

respectively immersing the gold-plated layers in a bath of mercury;

inverting one of the devices above the other;

bringing the devices together to effect contact between the mercury films from their centers to their edges;

pressing the devices together within a pressure range of 2 kilograms per square inch to 20 kilograms per square inch for a minimum of 16 hours at room temperature; and sealing the periphery of the gold-mercury seal contact with nickel.

17. A method of bonding together devices having different coefficients of thermal expansion comprising the steps of:

placing nickel layers of about 700 Angstroms respectively of the devices;

lapping the surfaces of the nickel layers to about a 20,000 Angstrom smoothness;

plating layers of gold of about 4 microns thickness respectively on the nickel layers;

respectively immersing the gold-plated layers in a bath of mercury;

inverting one of the devices above the other;

bringing the devices together to effect contact between the mercury films from their centers to their edges;

pressing the devices together within a pressure range of 2 kilograms per square inch to 20 kilograms per square inch for a minimum of 16 hours at room temperature; and sealing the periphery of the gold-mercury seal contact with nickel.

* * * * *

UNITED STATES PATENT AND TRADEMARK OFFICE
CERTIFICATE OF CORRECTION

PATENT NO. : 4,863,090

DATED : September 5, 1989

INVENTOR(S) : Barret Lippey

It is certified that error appears in the above-identified patent and that said Letters Patent is hereby corrected as shown below:

Column 1, line 13, after "mercury", insert --a hyphen (-)--.
Column 1, line 64, after "mercury", insert --a hyphen (-)--.
Column 2, line 13, after "high", insert --a hyphen (-)--.
Column 2, line 59, after "high", insert --a hyphen (-)--.
Column 3, line 54, before and after "to" insert --a hyphen (-)--.
Column 5, lines 21 - 33, replace with Claim 7 as amended 7.    A method of bonding devices together comprising the steps of:

placing gold layers respectively on both devices;

wetting the gold layers with mercury for providing a mercury film thereover including a mercury-gold amalgam; and mating the two devices together by placing one device above the other for causing the mercury film on one of the devices to be gravitationally downwardly suspended, thus permitting the mercury film to bulge at its center towards the other of the devices and the mercury thereon, and

UNITED STATES PATENT AND TRADEMARK OFFICE
CERTIFICATE OF CORRECTION

PATENT NO. : 4,863,090

DATED : September 5, 1989

INVENTOR(S) : Barret Lippey

It is certified that error appears in the above-identified patent and that said Letters Patent is hereby corrected as shown below:

moving the devices together for enabling initial contact between the centers of the respective mercury films and thence for extending the contact from the centers to the exteriors of the devices, thereby to exclude voids between the contacting mercury films.

Signed and Sealed this

Ninth Day of June, 1992

Attest:

DOUGLAS B. COMER

*Attesting Officer*  *Acting Commissioner of Patents and Trademarks*